(12) United States Patent
Ono

(10) Patent No.: US 11,966,679 B2
(45) Date of Patent: Apr. 23, 2024

(54) INFORMATION PROCESSING APPARATUS AND NON-TRANSITORY COMPUTER READABLE MEDIUM

(71) Applicant: FUJIFILM Business Innovation Corp., Tokyo (JP)

(72) Inventor: Takanobu Ono, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 355 days.

(21) Appl. No.: 17/329,188

(22) Filed: May 25, 2021

(65) Prior Publication Data
US 2022/0138390 A1 May 5, 2022

(30) Foreign Application Priority Data
Oct. 29, 2020 (JP) ................................. 2020-181906

(51) Int. Cl.
*G06F 30/347* (2020.01)

(52) U.S. Cl.
CPC ................................. *G06F 30/347* (2020.01)

(58) Field of Classification Search
CPC ........ G06F 30/347; G06F 30/34; G06F 30/30; G06F 30/39
See application file for complete search history.

(56) References Cited

U.S. PATENT DOCUMENTS 10,651,853 B1 * 5/2020 Kong ..................... G06F 30/392
2022/0069823 A1 * 3/2022 Sasaki .............. H03K 19/17758

FOREIGN PATENT DOCUMENTS

JP 3877002 2/2007

* cited by examiner

*Primary Examiner* — Stacy Whitmore
(74) *Attorney, Agent, or Firm* — JCIPRNET

(57) ABSTRACT

An information processing apparatus includes a processor connected to a programmable logic circuit and configured to: acquire a software module indicating first processing and start the first processing; reconfigure a hardware module in the programmable logic circuit, the hardware module indicating second processing included in the first processing; and, if reconfiguration of the hardware module is completed before the first processing is completed, supply intermediate data generated by the first processing to the hardware module and cause the programmable logic circuit to start to execute the second processing.

20 Claims, 10 Drawing Sheets

| MODULE ID | SOFTWARE MODULE | HARDWARE MODULE | |
|---|---|---|---|
| M1 | ... | ... | 121 |
| M2 | ... | ... | |
| M3 | ... | ... | |
| ... | ... | ... | |

| PROGRAM ID | MODULE TO BE USED | PROGRAM DATA | |
|---|---|---|---|
| P1 | M1→M2→M3 | ... | 122 |
| P2 | M2→M1 | ... | |
| P3 | M1→M3 | ... | |
| ... | ... | ... | |

INFORMATION PROCESSING APPARATUS AND NON-TRANSITORY COMPUTER READABLE MEDIUM

CROSS-REFERENCE TO RELATED APPLICATIONS

This application is based on and claims priority under 35 USC 119 from Japanese Patent Application No. 2020-181906 filed Oct. 29, 2020.

BACKGROUND

(i) Technical Field

The present disclosure relates to an information processing apparatus and a non-transitory computer readable medium.

(ii) Related Art

For example, Japanese Patent No. 3877002 discloses an information processing system that stores a software module and a hardware module for executing common processing by using a processor and by using a programmable logic circuit, respectively, determines whether reconfiguration of the hardware module is completed in the programmable logic circuit, and, if reconfiguration of the hardware module is completed, executes the processing by using the programmable logic circuit reconfigured by using the hardware module.

SUMMARY

Aspects of non-limiting embodiments of the present disclosure relate to reducing the time from the start to the completion of first processing compared with a case where the first processing indicated by a software module is not allowed to be executed during reconfiguration of a hardware module indicating second processing included in the first processing.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided an information processing apparatus including a processor connected to a programmable logic circuit and configured to: acquire a software module indicating first processing and start the first processing; reconfigure a hardware module in the programmable logic circuit, the hardware module indicating second processing included in the first processing; and, if reconfiguration of the hardware module is completed before the first processing is completed, supply intermediate data generated by the first processing to the hardware module and cause the programmable logic circuit to start to execute the second processing.

BRIEF DESCRIPTION OF THE DRAWINGS

An exemplary embodiment of the present disclosure will be described in detail based on the following figures, wherein.

DETAILED DESCRIPTION

Exemplary Embodiment

Configuration of Information Processing Apparatus

Figures 1, 2, 3:
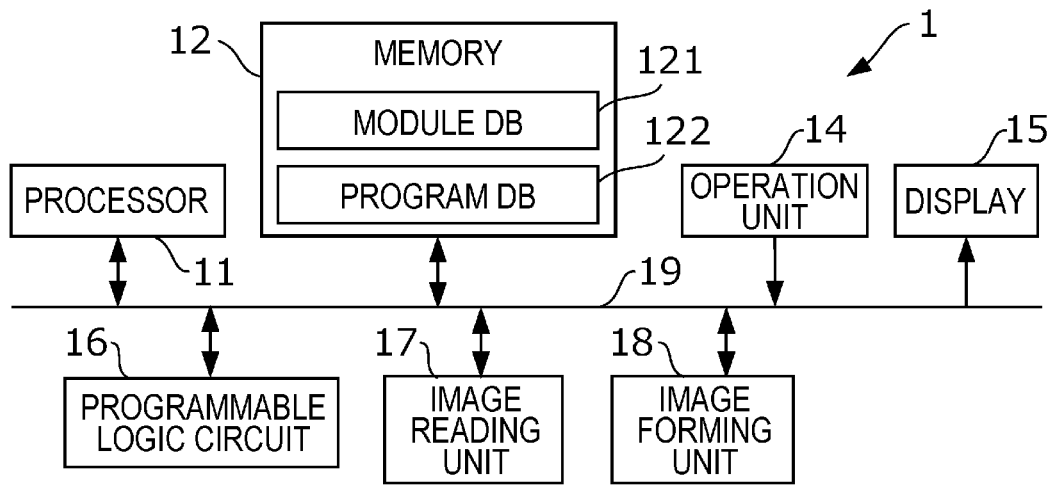
FIG. 1 illustrates an example of the configuration of an information processing apparatus.
FIG. 2 illustrates an example of a module database (DB)
FIG. 3 illustrates an example of a program DB.

FIG. 1 illustrates an example of the configuration of an information processing apparatus 1. The information processing apparatus 1 is, for example, an apparatus that processes information such as image data representing an image, any computer program (hereinafter simply referred to as program), or a module. The module is data that indicates processing called by a program and that is executable.

The information processing apparatus 1 illustrated in FIG. 1 includes a processor 11, a memory 12, an operation unit 14, a display 15, a programmable logic circuit 16, an image reading unit 17, and an image forming unit 18. These components are communicably connected to one another via a bus 19.

The bus 19 includes a host bus and a memory bus. The host bus connects the processor 11 to a chip set (not illustrated). The memory bus connects a memory controller (not illustrated) included in the chip set and the memory 12 to each other. The bus 19 further includes a peripheral component interconnect (PCI) bus and a host-PCI bus bridge. The PCI bus connects the processor 11 and the programmable logic circuit 16 to each other. The host-PCI bus bridge connects the PCI bus and the above-described host bus to each other. In addition, the bus 19 may further include an image bus for transmitting or receiving image data to be used by the image reading unit 17 or the image forming unit 18.

The processor 11 controls the components of the information processing apparatus 1 by reading and executing a program stored in the memory 12. The processor 11 is, for example, a central processing unit (CPU).

The processor 11 also acquires the above-described module called by the program from the memory 12 and executes the module or instructs the programmable logic circuit 16 to execute the module.

The module stored in the memory 12 is distinguished between a software module and a hardware module. The software module is a module executable by the processor 11. The hardware module is a module executable by the programmable logic circuit 16. Processing indicated by the software module and executed by the processor 11 is referred to as first processing. Processing indicated by the hardware module and executed by the programmable logic circuit 16 is referred to as second processing.

The operation unit 14 includes operators such as an operation button, a keyboard, a mouse, and a touch panel for issuing various instructions. Upon receiving a user operation, the operation unit 14 transmits a signal corresponding to details of the user operation to the processor 11.

The display 15 displays a designated image under the control of the processor 11 or the programmable logic circuit 16. The display 15 illustrated in FIG. 1 includes a liquid crystal display that is a display screen for displaying the above-described image. A transparent touch panel as the operation unit 14 may be superposed and disposed on the liquid crystal display.

The image reading unit 17 includes imaging elements and the like such as a light emitting device such as a light emitting diode (LED), an optical system such as a lens or a prism, a complementary metal oxide semiconductor (CMOS) image sensor, and a charge coupled device (CCD) image sensor. Under the control of the processor 11 or the programmable logic circuit 16, the image reading unit reads an image formed on a medium such as paper and generates image data representing the read image to be supplied to the processor 11.

Under the control of the processor 11 or the programmable logic circuit 16, the image forming unit 18 forms an image on a medium such as paper by, for example, an electrophotographic system.

The memory 12 is a storage that stores an operating system, various programs, modules, other data, and the like to be read by the processor 11. The memory 12 includes a random access memory (RAM) and a read only memory (ROM). Note that the memory 12 may also include a solid state drive, a hard disk drive, and the like. In addition, the memory 12 stores a module database (DB) 121 and a program DB 122.

FIG. 2 illustrates an example of the module DB 121. The module DB 121 is a database storing a set of one software module and one hardware module in association with each other. In the module DB 121, a cell of a module ID stores "module ID" that is identification information for identifying a module.

A cell of a software module stores a software module that is identified by a corresponding module ID and that is executable by the processor 11. A cell of a hardware module stores a hardware module that is identified by a corresponding module ID and that is executable by the programmable logic circuit 16. The cell of the hardware module stores data to be used at the time of reconfiguration (also referred to as configuration data) in the programmable logic circuit 16.

FIG. 3 illustrates an example of the program DB 122. The program DB 122 illustrated in FIG. 3 stores a program ID, module to be used, and program data in association with each other. A cell of the program ID illustrated in FIG. 3 stores identification information of a program to be designated in the information processing apparatus 1.

A cell of the module to be used illustrated in FIG. 3 stores identification information of each of one or more modules to be used in a program identified by the corresponding program ID. In the cell of the module to be used, as illustrated in FIG. 3, the order of modules to be called by the program may be described. For example, a program with the program ID "P1" illustrated in FIG. 3 calls and executes modules identified by module IDs "M1", "M2", and "M3" and in the order of the module IDs "M1"→"M2"→"M3".

A cell of the program data illustrated in FIG. 3 stores data indicating details of a program identified by the corresponding program ID.

The programmable logic circuit 16 illustrated in FIG. 1 is a logic circuit in which a hardware module implementing a function is reconfigurable under the control of the processor 11 and is, for example, a field programmable gate array (FPGA). The programmable logic circuit 16 illustrated in FIG. 1 controls at least any of the display 15, the image reading unit 17, and the image forming unit 18. Note that the targets controlled by the programmable logic circuit 16 are not limited to these. In addition, the programmable logic circuit 16 may control none of these.

Figure 4:
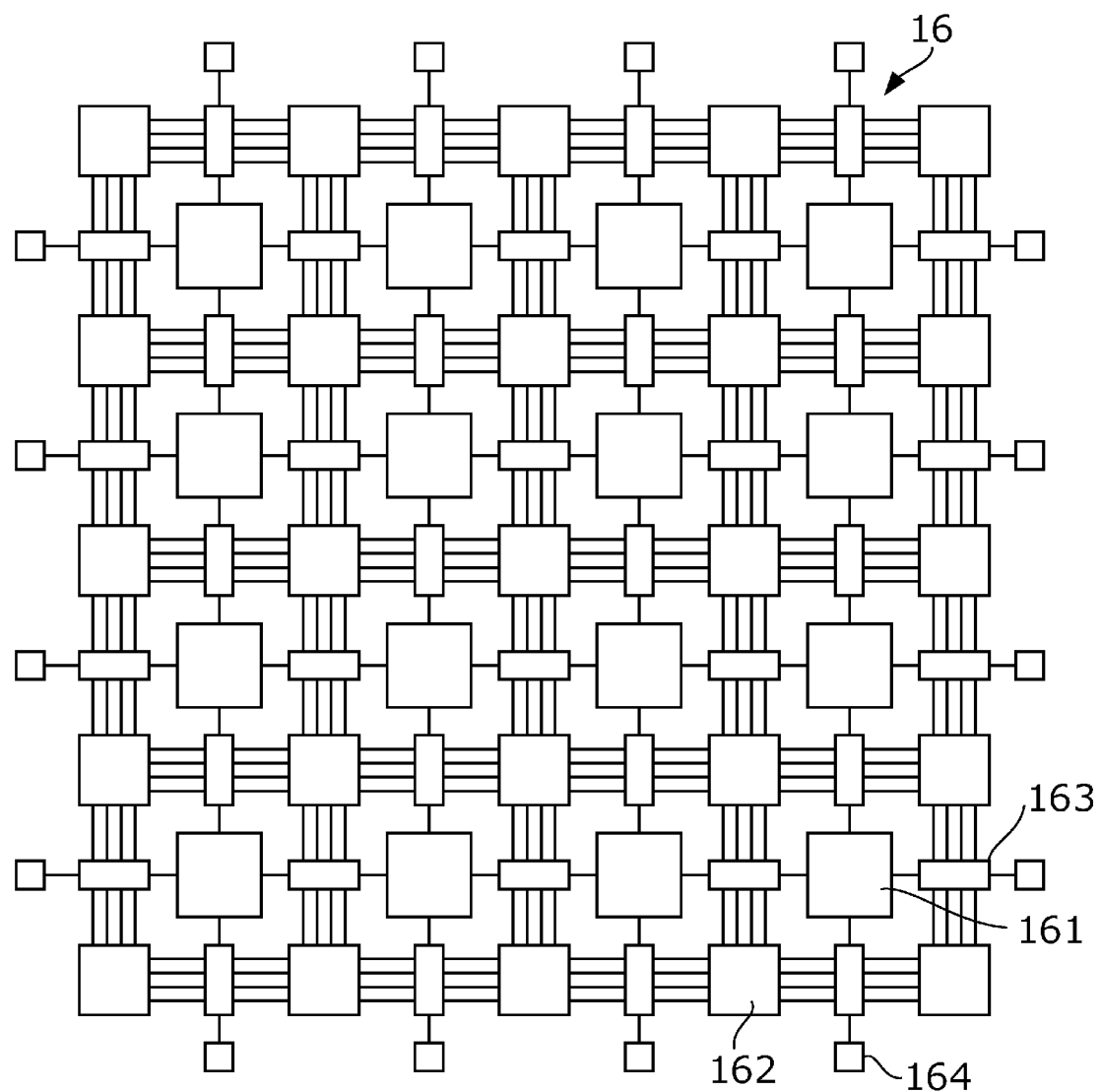
FIG. 4 illustrates an example of the configuration of a programmable logic circuit.

FIG. 4 illustrates an example of the configuration of the programmable logic circuit 16. The programmable logic circuit 16 illustrated in FIG. 4 is a so-called island-style FPGA.

The programmable logic circuit 16 includes plural logic blocks 161, switch blocks 162, connection blocks 163, and input/output terminals 164 that are arrayed in a grid shape. That is, the programmable logic circuit 16 is an example of a programmable logic circuit including plural logic blocks arrayed in a grid shape. Note that the programmable logic circuit 16 illustrated in FIG. 4 is a simplified diagram, and the numbers of logic blocks 161 and the like are not limited to those illustrated in FIG. 4.

Each of the logic blocks 161 is a block serving as a unit for forming a circuit that implements various functions, such as a logic circuit, an arithmetic circuit, or a memory circuit, by using a truth table circuit or the like.

The switch blocks 162 and the connection blocks 163 form a wiring region together with wirings connecting the switch blocks 162 and the connection blocks 163 to each other.

Each of the switch blocks 162 is a block that switches connection between wirings. Each of the connection blocks 163 is a block that switches input/output of the corresponding logic block 161 and connection with the above-described wiring region.

Each of the switch blocks 162 and the connection blocks 163 is formed by, for example, a switch using a bus transistor and a control configuration memory therefor.

Each of the input/output terminals 164 is a block that communicably connects the programmable logic circuit 16 and the processor 11 to each other and serves as an interface for input from the processor 11 and output to the processor 11. The input/output terminals 164 illustrated in FIG. 4 are connected to the above-described wiring region.

Through the input/output terminals 164 in the programmable logic circuit 16, the processor 11 writes the configuration data stored in the memory 12 into each of the logic blocks 161, the switch blocks 162, and the connection blocks 163, thereby, reconfiguring the programmable logic circuit 16.

Note that the programmable logic circuit 16 may also include, for example, a digital signal processor (DSP) used for execution of predetermined processing.

The programmable logic circuit 16 may also include therein an in-device memory that is more easily accessible than the memory 12. The in-device memory is, for example, a storage device such as a double-data-rate synchronous dynamic random access memory (DDR SDRAM). In this case, any of the input/output terminals 164 included in the programmable logic circuit 16 is connected to the in-device memory and relays access to the in-device memory requested from a hardware module reconfigured in the programmable logic circuit 16.

In addition, in the information processing apparatus 1, the processor 11 and the programmable logic circuit 16 may be, for example, mounted together on a single chip, as in a device called system on a chip (SoC) FPGA, and configured to work in close cooperation with each other.

Figure 5:
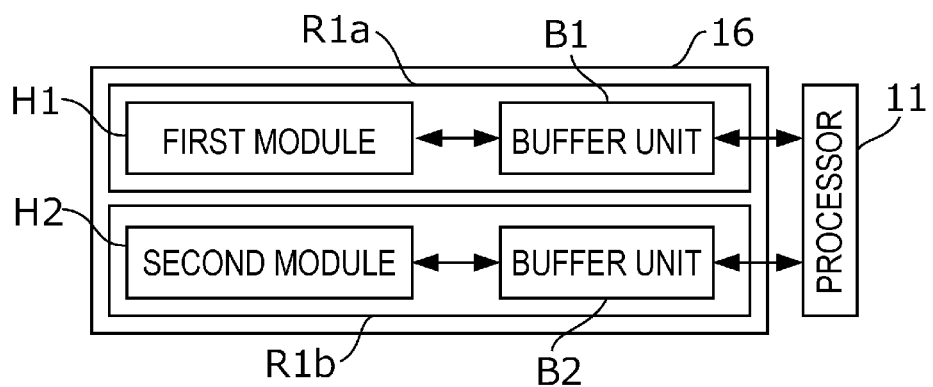
FIG. 5 illustrates examples of regions of the programmable logic circuit.

FIG. 5 illustrates examples of regions of the programmable logic circuit 16. As illustrated in FIG. 5, the programmable logic circuit 16 divides the plural logic blocks 161 (FIG. 4), arrayed in a grid shape, into plural regions in accordance with the positions thereof. The programmable logic circuit 16 illustrated in FIG. 5 includes two reconfiguration regions R1*a* and R1*b*. The reconfiguration regions R1*a* and R1*b* will be referred to as reconfiguration regions R1 if they are not distinguished from each other.

The reconfiguration regions R1 are regions reconfigured in response to an instruction from the processor 11. In each of the plural reconfiguration regions R1, one module and one buffer unit are reconfigured.

As illustrated in FIG. 5, a first module H1 and a buffer unit B1 are reconfigured in the reconfiguration region R1*a*. The first module H1 is, for example, a hardware module corresponding to the above-described module ID "M1".

In addition, as illustrated in FIG. 5, a second module H2 and a buffer unit B2 are reconfigured in the reconfiguration region R1*b*. The second module H2 is, for example, a hardware module corresponding to the above-described module ID "M2".

The first module H1 is reconfigured in the reconfiguration region R1*a* while the processor 11 is executing (that is, after the start and before the completion of) the first processing indicated by the software module corresponding to the module ID "M1". Upon reconfiguration being completed, the processor 11 transfers, to the buffer unit B1, data (hereinafter referred to as intermediate data) that is generated by execution of the above-described first processing. The first module H1 takes over the intermediate data transferred to the buffer unit B1 and starts to execute the second processing indicated by the first module H1.

In addition, the second module H2 is reconfigured in the reconfiguration region R1*b* while the processor 11 is executing the first processing indicated by the software module corresponding to the module ID "M2". Upon reconfiguration being completed, the processor 11 transfers, to the buffer unit B2, intermediate data generated by execution of the above-described first processing. The second module H2 takes over the intermediate data transferred to the buffer unit B2 and starts to execute the second processing indicated by the second module H2.

That is, the buffer units B1 and B2 are examples of a memory circuit reconfigured to store, in the programmable logic circuit 16, the intermediate data generated by the processor 11 in the first processing. Thus, the processor 11 is an example of a processor that reconfigures, in the programmable logic circuit, a memory circuit for storing the intermediate data and, if reconfiguration of the hardware module is completed before the first processing is completed, supplies the intermediate data from the memory circuit to the hardware module to cause the programmable logic circuit to start to execute the second processing.

Functional Configuration of Processor

Figure 6:
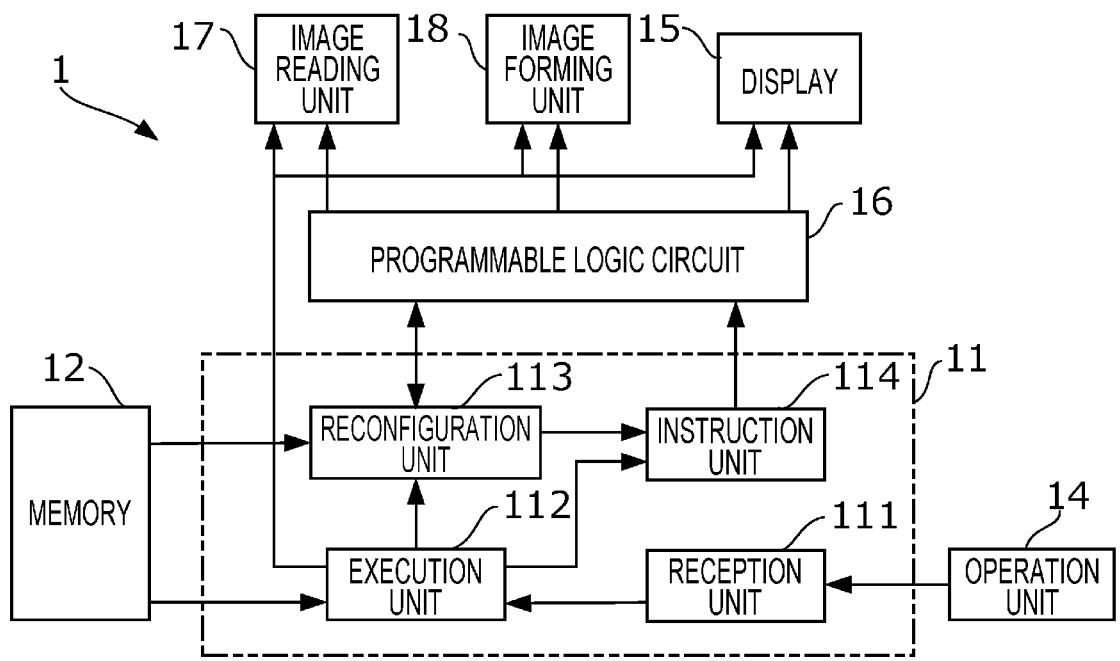
FIG. 6 illustrates an example of a functional configuration of a processor.

FIG. 6 illustrates an example of a functional configuration of the processor 11. The processor 11 in the information processing apparatus 1 executes a program stored in the memory 12 thereby functioning as a reception unit 111, an execution unit 112, a reconfiguration unit 113, and an instruction unit 114.

The reception unit 111 receives an instruction for executing a program from a user through the operation unit 14. Referring to the program DB 122 in the memory 12, the execution unit 112 designates a module to be used by the program indicated by the instruction from the user received by the reception unit 111. The execution unit 112 acquires a software module corresponding to a module ID indicating the designated module from the module DB 121 in the memory 12 and executes first processing.

The software module may control any of the image reading unit 17, the image forming unit 18, and the display 15. Upon starting execution of the first processing indicated by the above-described software module, the execution unit 112 notifies the reconfiguration unit 113 of the start of execution of the first processing. In addition, the execution unit 112 supplies intermediate data generated by execution of the first processing to the instruction unit 114.

Upon being notified by the execution unit 112 of the start of execution of the first processing indicated by the software module, the reconfiguration unit 113 acquires a hardware module associated with the software module from the module DB 121 in the memory 12. The reconfiguration unit 113 writes the acquired hardware module into any of the reconfiguration regions R1 in the programmable logic circuit 16 for reconfiguration.

Upon reconfiguration of the hardware module being completed, the reconfiguration unit 113 notifies the instruction unit 114 that reconfiguration of the hardware module is completed. If there are plural modules to be used by the program indicated by the instruction from the user, the reconfiguration unit 113 may start reconfiguration of corresponding plural hardware modules in the order indicated in the program DB 122, for example, without waiting for a notification from the execution unit 112 about the start of the first processing indicated by the respective software modules.

If the above-described reconfiguration of the hardware module by the reconfiguration unit 113 is completed before the first processing by the execution unit 112 is completed, the instruction unit 114 instructs a circuit implemented by the reconfigured hardware module to start to execute second processing. At this time, the instruction unit 114 supplies the intermediate data generated by the execution unit 112 to the above-described hardware module. By using the supplied intermediate data, the programmable logic circuit 16 starts to execute the second processing indicated by the hardware module. Note that, when supplying the intermediate data to the hardware module, the instruction unit 114 may cause the execution unit 112 to stop execution of the first processing indicated by the software module.

Operations of Information Processing Apparatus

Figure 7:
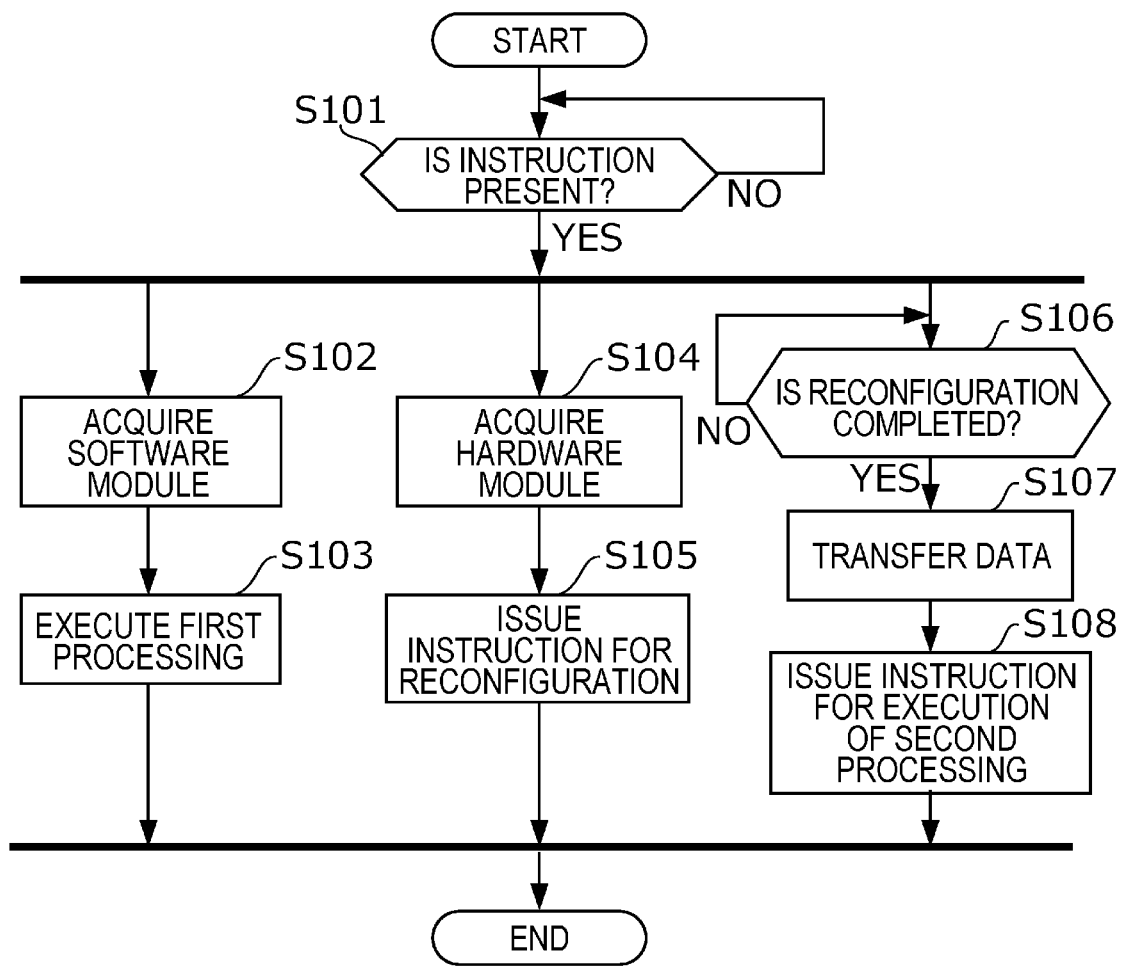
FIG. 7 is a flowchart illustrating an example of an operation flow of the processor.

FIG. 7 is a flowchart illustrating an example of an operation flow of the processor 11. Upon the information processing apparatus 1 being started, the processor 11 monitors the operation unit 14 and determines whether an instruction for executing a program from a user is present (step S101). While it is determined that the instruction is not present (step S101; NO), the processor 11 continues this determination.

On the other hand, if it is determined that the above-described instruction is present (step S101; YES), the processor 11 starts the following three types of processing concurrently.

First processing is processing indicated by step S102 and step S103 in FIG. 7. The processor 11 acquires, from the memory 12, a software module to be used by the program designated by the user (step S102). The processor 11 executes first processing indicated by the acquired software module (step S103).

Second processing is processing indicated by step S104 and step S105 in FIG. 7. The processor 11 acquires, from the memory 12, a hardware module associated with the software module to be used by the program designated by the user (step S104). The processor 11 supplies the acquired hardware module to the programmable logic circuit 16 and issues an instruction for reconfiguration of the hardware module (step S105).

Third processing is processing indicated by step S106, step S107, and step S108 in FIG. 7. The processor 11 determines whether reconfiguration is completed in the programmable logic circuit 16 as instructed concurrently (step S106). If it is determined that reconfiguration is not completed (step S106; NO), the processor 11 continues this determination. On the other hand, if it is determined that reconfiguration is completed (step S106; YES), the processor 11 transfers intermediate data generated by execution of the first processing to the hardware module for which reconfiguration is completed (step S107) and instructs the programmable logic circuit 16 to execute second processing associated with the first processing by using the transferred intermediate data (step S108).

Through the above-described operations, if reconfiguration of the associated hardware module is completed before the processor 11 completes the first processing indicated by the software module, the programmable logic circuit 16 starts to execute the second processing indicated by the reconfigured hardware module without waiting for the first processing to be completed. As a result, the waiting time of the programmable logic circuit 16 is reduced, and the total time for execution of the program designated by the user is shortened.

Figure 8:
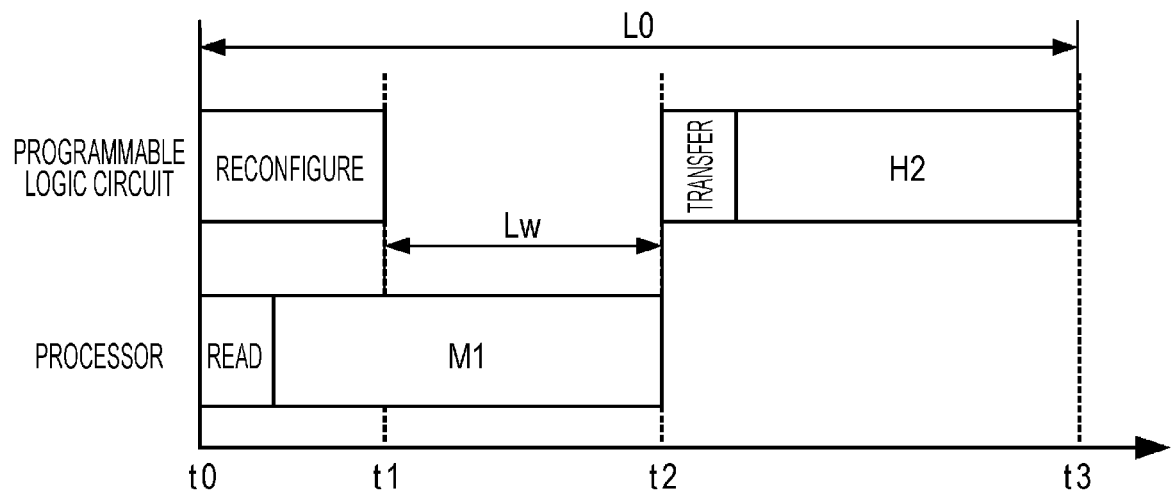
FIG. 8 illustrates a total processing time according to the related art.

FIG. 8 illustrates a total processing time according to the related art. As illustrated in FIG. 8, according to the related art, the subject that executes processing indicated by a module is determined for each module depending on the progress of reconfiguration. Thus, for example, as illustrated in FIG. 8, even if reconfiguration of a hardware module in a programmable logic circuit is completed in a period from time t0 to time t1, the programmable logic circuit is incapable of starting second processing indicated by the hardware module until time t2 at which first processing concurrently executed by a processor is completed, the first processing being indicated by a software module indicated by the module ID "M1". As a result, according to the related art, as illustrated in FIG. 8, a waiting time Lw from time t1 to time t2 is generated, and a program for executing the module IDs "M1"→"M2" takes a total time L0 from time t0 to time t3.

Figure 9:
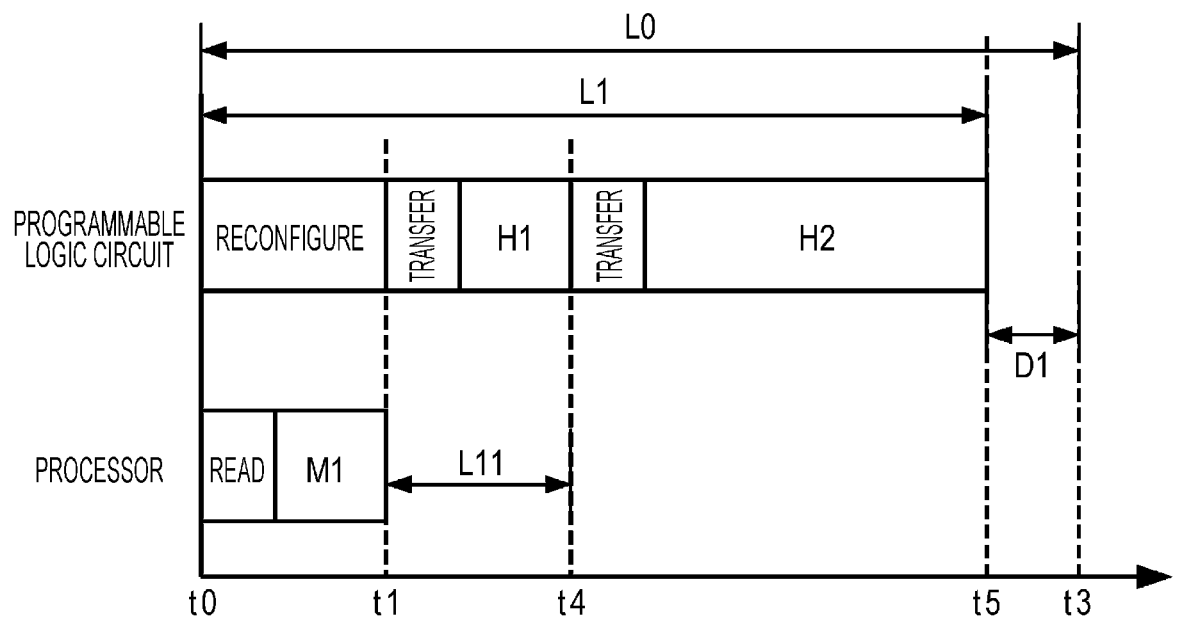
FIG. 9 illustrates a total processing time of the information processing apparatus.

FIG. 9 illustrates a total processing time of the information processing apparatus 1 described above. In the information processing apparatus 1 described above, upon reconfiguration of the first module H1 being completed, which is a hardware module, in a period from time t0 to time t1, without waiting for the processor 11 to complete the first processing indicated by the software module indicated by the module ID "M1", the intermediate data is transferred, and the programmable logic circuit 16 starts to execute the second processing associated with the first processing. The second processing is processing indicated by the first module H1.

Typically, the second processing by the programmable logic circuit 16 is executed at a higher speed than the first processing by the processor 11. Thus, remaining processing of the first processing, which has progressed and is not completed at time t1, is executed in the second processing by the programmable logic circuit 16 at a higher speed than being executed by the processor 11.

For example, the second processing indicated by the first module H1 illustrated in FIG. 9 is executed in a processing time L11 including the time for transferring data prior to the execution. This is shorter than the above-described waiting time Lw and ends at time t4, which is earlier than time t2. As a result, the subsequent second processing indicated by the second module H2 is started at time t4, without waiting for time t2, and all processing is completed at time t5, which is earlier than time t3. That is, as illustrated in FIG. 9, the information processing apparatus 1 executes the above-described program that uses the module IDs "M1"→"M2" in a total time L1, which is shorter than the above-described total time L0. Thus, the time in which all processing is expected to be executed is shortened by a time D1. That is, the information processing apparatus 1 described above may reduce the time from the start to the completion of the first processing compared with a case in which the first processing indicated by the software module is not allowed to be executed during reconfiguration of the hardware module indicating the second processing included in the first processing.

Modifications

The exemplary embodiment has been described above. However, details of the exemplary embodiment may be modified as follows. In addition, the following modifications may be combined with one another.

First Modification

In the embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

In the embodiments above, the term "processor" is broad enough to encompass one processor or plural processors in collaboration which are located physically apart from each other but may work cooperatively. The order of operations of the processor is not limited to one described in the embodiments above, and may be changed.

Second Modification

In the above-described exemplary embodiment, if the hardware module, which indicates the second processing associated with the first processing, is reconfigured in the programmable logic circuit 16 during execution of the first processing, the processor 11 stores the intermediate data generated by execution of the first processing in the memory circuit that is being reconfigured in the programmable logic circuit 16. However, the intermediate data is not necessarily stored in the memory circuit until reconfiguration is completed. That is, the processor 11 in this case is an example of a processor that refrains from storing the intermediate data in the memory circuit if reconfiguration of the hardware module is not completed before the first processing is completed, and stores the intermediate data in the memory circuit if reconfiguration of the hardware module is completed before the first processing is completed.

Third Modification

In the above-described exemplary embodiment, the buffer unit B1 and the buffer unit B2 are reconfigured in the reconfiguration region R1a and the reconfiguration region R1b, respectively. However, in addition to the reconfiguration regions R1, the programmable logic circuit 16 may also include a static region that is reconfigured once at the time of start. In addition, the above-described memory circuit may be reconfigured in the static region. Furthermore, in the static region, a switching circuit may be reconfigured, which switches a subject that uses the above-described memory circuit from either one of the processor 11 and a hardware module reconfigured in the programmable logic circuit 16 to the other.

Figure 10:
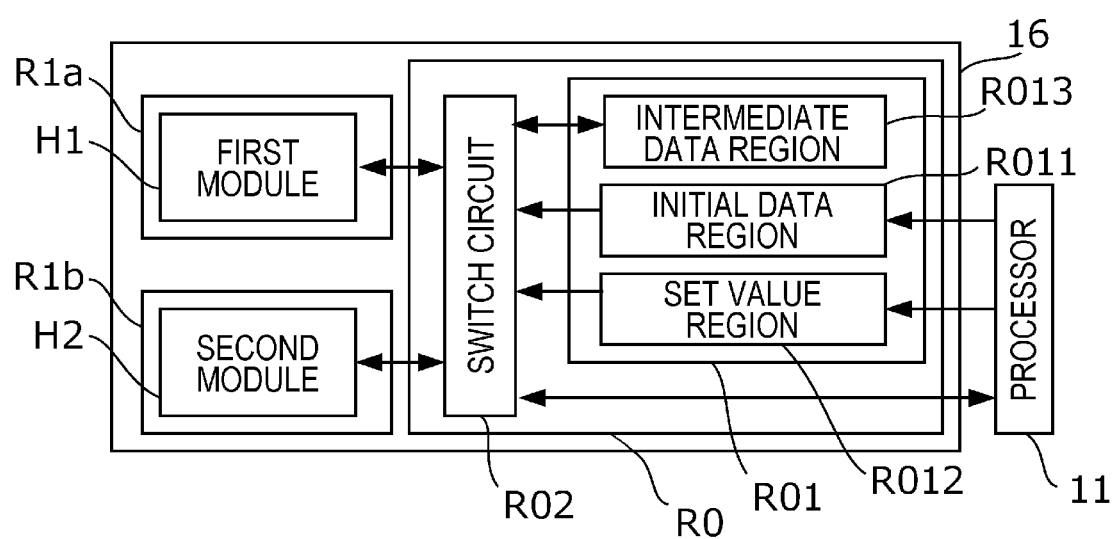
FIG. 10 illustrates a switching circuit.

FIG. 10 illustrates a switching circuit R02. The programmable logic circuit 16 illustrated in FIG. 10 includes a static region R0 in addition to the reconfiguration regions R1a and R1b. The static region R0 is a region that is reconfigured at the time of start when power supply to the information processing apparatus 1 starts. The static region R0 includes a memory circuit R01 and the switching circuit R02.

The memory circuit R01 illustrated in FIG. 10 includes an initial data region R011, a set value region R012, and an intermediate data region R013. The initial data region R011 is a region storing initial data to be used when the processor 11 starts first processing. The set value region R012 is a region storing set values to be used when the processor 11 executes the first processing or when the programmable logic circuit 16 executes second processing. The intermediate data region R013 is a region storing intermediate data generated while the processor 11 is executing the first processing.

If predetermined conditions are satisfied, the switching circuit R02 illustrated in FIG. 10 switches a subject that uses the above-described memory circuit R01 from either one of the processor 11 and a hardware module reconfigured in the programmable logic circuit 16 to the other. For example, if reconfiguration of the hardware module indicating the second processing associated with the first processing is completed before the first processing by the processor 11 is completed, the switching circuit R02 switches the subject that uses the above-described memory circuit R01 from the processor 11 to the reconfigured hardware module.

That is, the processor 11 is an example of a processor that reconfigures, in the programmable logic circuit, a switching circuit that switches a subject that uses the memory circuit from either one of the processor and the hardware module to the other and, if reconfiguration of the hardware module is completed before the first processing is completed, causes the switching circuit to switch the subject from the processor to the hardware module.

Figure 11:
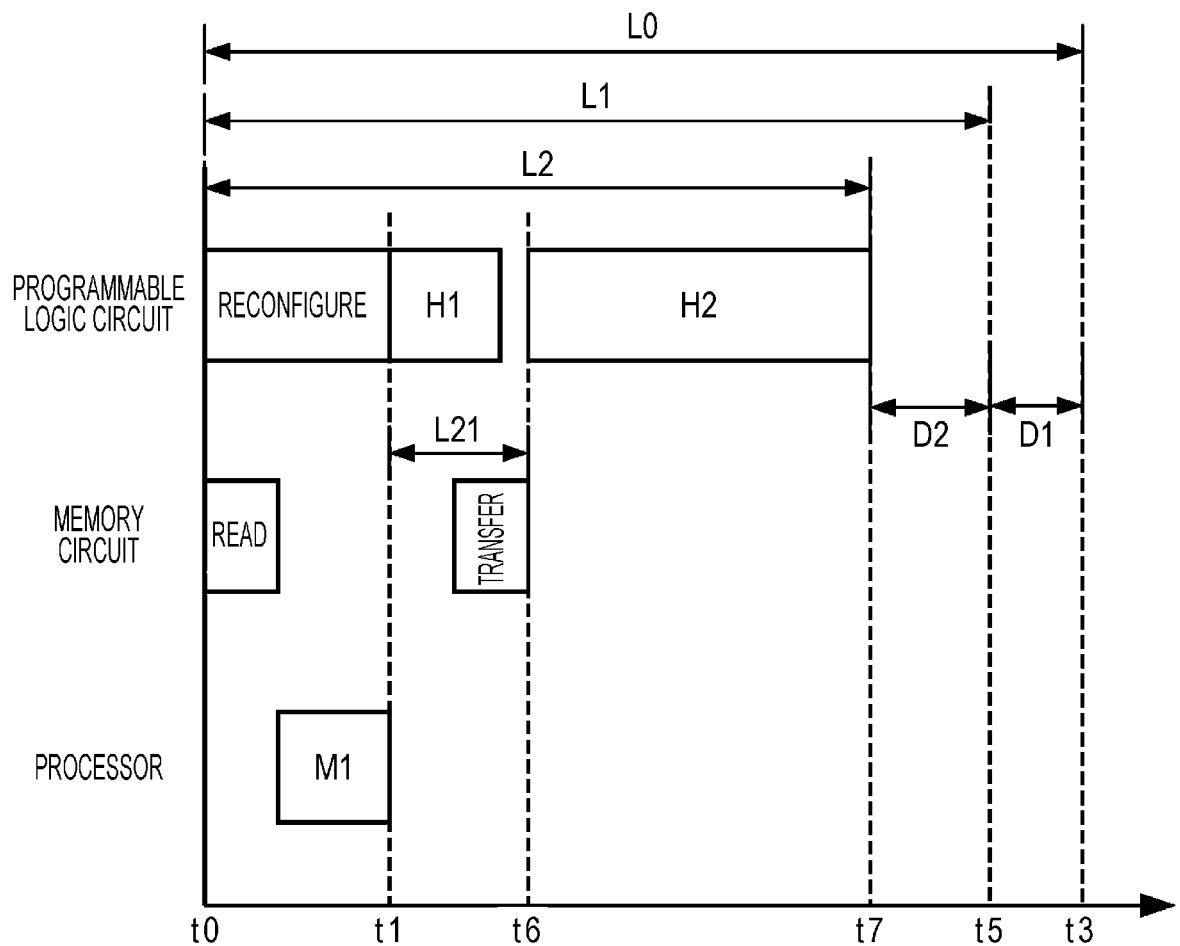
FIG. 11 illustrates a total processing time of the information processing apparatus according to a modification.

FIG. 11 illustrates a total processing time of the information processing apparatus 1 according to a modification. In the information processing apparatus 1, concurrently with reconfiguration of the first module H1 in the programmable logic circuit 16, the processor 11 transfers data to be used by the first module H1 to the memory circuit R01. Thus, upon reconfiguration of the first module H1 in the programmable logic circuit 16 being completed at time t1, without transferring the intermediate data from the processor 11 again, the first module H1 may start to execute the second processing by referring to the memory circuit R01.

For example, the second processing indicated by the first module H1 illustrated in FIG. 11 is executed in a processing time L21 in which the time for transferring data is shorter than that in the second processing illustrated in FIG. 9. This is shorter than the above-described processing time L11 and ends at time t6, which is earlier than time t4.

Furthermore, in the subsequent second processing indicated by the second module H2, since the initial data and the like are acquired from the memory circuit R01 reconfigured in the static region R0, the time for acquiring data is shorter than that in a case where data is acquired from a buffer unit reconfigured in a reconfiguration region R1 or from the memory 12. Thus, in this modification, all processing is completed at time t7, which is earlier than time t5. That is, as illustrated in FIG. 11, the information processing apparatus 1 executes the above-described program that uses the module IDs "M1"→"M2" in a total time L2, which is shorter than the above-described total time L1. Thus, the time in which all processing is expected to be executed is shortened by a time D2 compared with a case illustrated in FIG. 9.

Note that reconfiguration of the second module H2 in the programmable logic circuit 16 has already been completed before the processor 11 executes a software module associated with the second module H2. In this case, the processor 11 may execute no software module associated with the above-described second module H2.

That is, the processor 11 is an example of a processor that causes, before the first processing is started, the memory circuit to store initial data to be used when the first processing is started, and if reconfiguration of the hardware module is completed before the first processing is started, without starting the first processing, supplies the initial data from the memory circuit to the hardware module and causes the programmable logic circuit to start to execute the second processing.

Fourth Modification

In the above-described exemplary embodiment, the hardware module reconfigured in the programmable logic circuit 16 starts the second processing by using the intermediate data. The intermediate data supplied to the hardware module may include progress information indicating a progress stage when the second processing is started.

Figure 12:
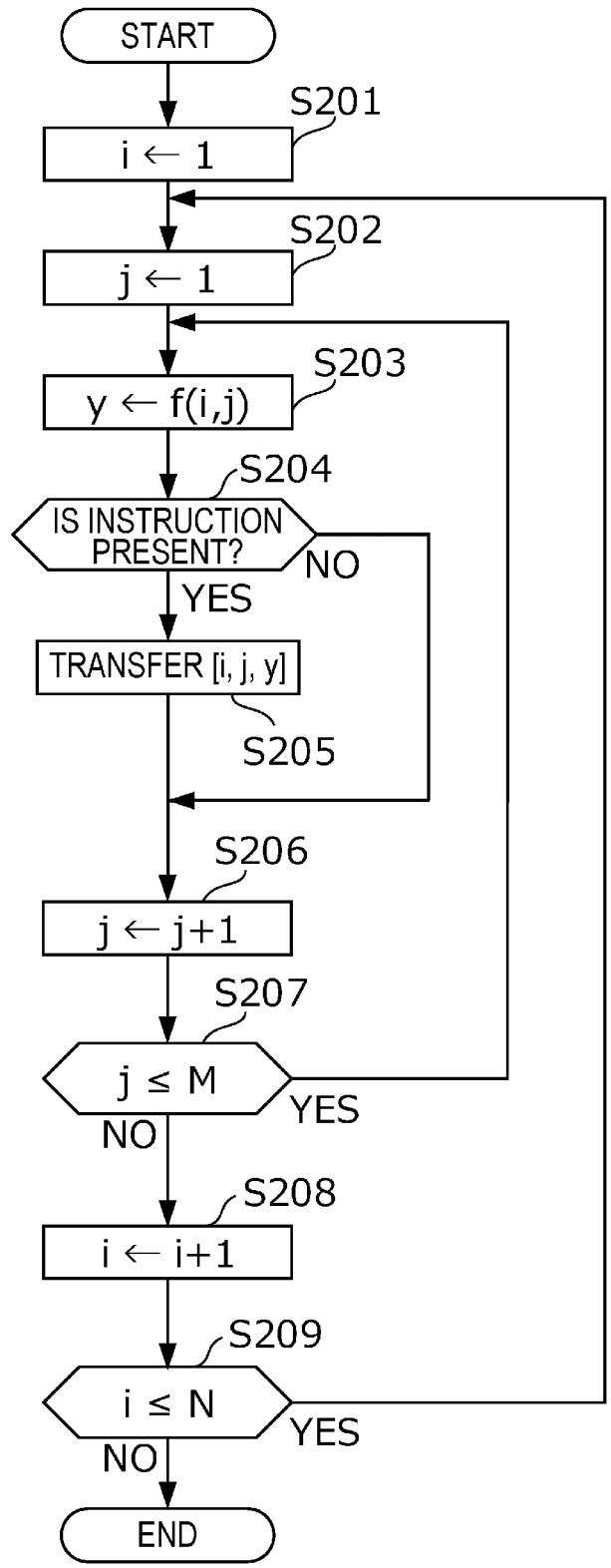
FIG. 12 is a flowchart for illustrating intermediate data including progress information.

FIG. 12 is a flowchart for illustrating intermediate data including progress information. When executing first processing in accordance with an acquired software module, the processor 11 initializes a variable i and a variable j, which are iterators, to 1 (step S201 and step S202), operates a function f(i,j) in accordance with the variable i and the variable j, and stores the results in a variable y (step S203).

Subsequently, for example, the processor 11 determines whether an interrupting instruction is present, the interrupting instruction indicating that intermediate data is to be transferred to the reconfigured memory circuit R01 or the like in the programmable logic circuit 16 (step S204). If it is determined that this instruction is present (step S204; YES), the processor 11 transfers, as the intermediate data, the variable y indicating the operation results and the set of the variable i and variable j indicating the progress stage (step S205), and advances the processing to step S206. That is, the intermediate data is an example of intermediate data including progress information indicating a progress stage of the first processing when the intermediate data is generated.

On the other hand, if it is determined that the above-described interrupting instruction is not present (step S204; NO), the processor 11 advances the processing to step S206, skipping step S205.

The processor 11 updates the variable j by adding 1, or increments the variable j (step S206), and determines whether the updated variable j is less than or equal to a threshold M (step S207). As long as the variable j is less than or equal to the threshold M (step S207; YES), the processor 11 iterates the processing from step S203 to step S207.

On the other hand, if it is determined that the variable j is not less than or equal to the threshold M (step S207; NO), the processor 11 updates the variable i by adding 1, or increments the variable i (step S208), and determines whether the updated variable i is less than or equal to a threshold N (step S209). As long as the variable i is less than or equal to the threshold N (step S209; YES), the processor 11 iterates the processing from step S202 to step S209.

On the other hand, if it is determined that the variable i is not less than or equal to the threshold N (step S209; NO), the processor 11 ends the processing. A software module that performs this operation increases the variable i from 1 to the threshold N one by one in a so-called outer loop and increases the variable j from 1 to the threshold M one by one in an inner loop. Subsequently, the software module calculates the variable y for each combination of the variable i and the variable j and transfers, as the intermediate data, the set of the variable i and variable j indicating the progress stage together with the variable y.

Upon the above-described intermediate data generated by the processor 11 being transferred, the hardware module reconfigured in the programmable logic circuit 16 extracts the set of the variable i and variable j from the intermediate data. On the basis of the extracted set of the variable i and variable j, the hardware module specifies the progress stage of the first processing and starts to execute the second processing from the progress stage.

In this case, the processor 11 is an example of a processor that, if reconfiguration of the hardware module is completed before the first processing is completed, causes the programmable logic circuit to start to execute the second processing from the progress stage indicated by the progress information included in the intermediate data.

Fifth Modification

In the above-described exemplary embodiment, the module DB 121 stores the set of one software module and one hardware module in association with each other. However, the hardware module associated with the software module in the module DB 121 may be generated in accordance with the software module.

Figure 13:
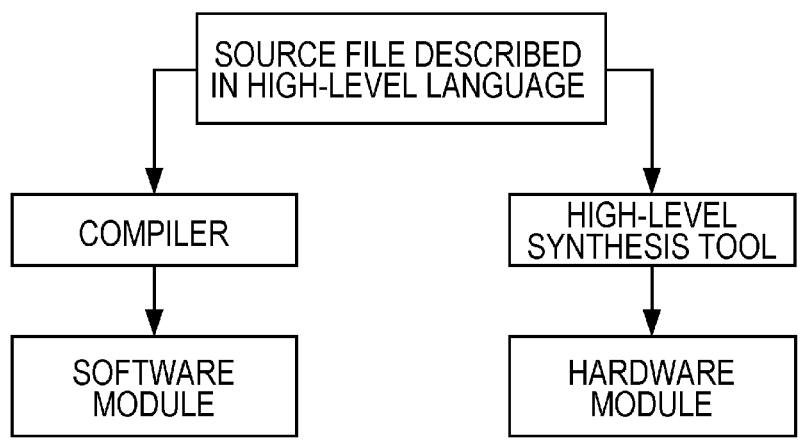
FIG. 13 illustrates an example in which a software module and a hardware module corresponding to each other are generated from a common source file.

Alternatively, the software module and the hardware module associated with each other in the module DB 121 may each be generated from a common source file. FIG. 13 illustrates an example in which the software module and the hardware module corresponding to each other are generated from a common source file. A so-called compiler illustrated in FIG. 13 interprets the source file described in a high-level language and generates a software module that is executable by the processor 11. In addition, a so-called high-level synthesis tool illustrated in FIG. 13 interprets the above-described source file and generates a hardware module that is reconfigurable in the programmable logic circuit 16 and that is executable. The software module and the hardware module generated from the common source file are stored in association with each other in the module DB 121.

Sixth Modification

In the above-described exemplary embodiment, the module DB 121 stores a hardware module in association with a software module, the hardware module indicating second processing included in first processing indicated by the software module. However, the second processing may be all processing included in the first processing.

In addition, the size of the second processing may be dynamically determined on the basis of a time during which the hardware module indicating the second processing is reconfigured in the programmable logic circuit 16 and a time during which the processor 11 executes the first processing.

Figure 14:
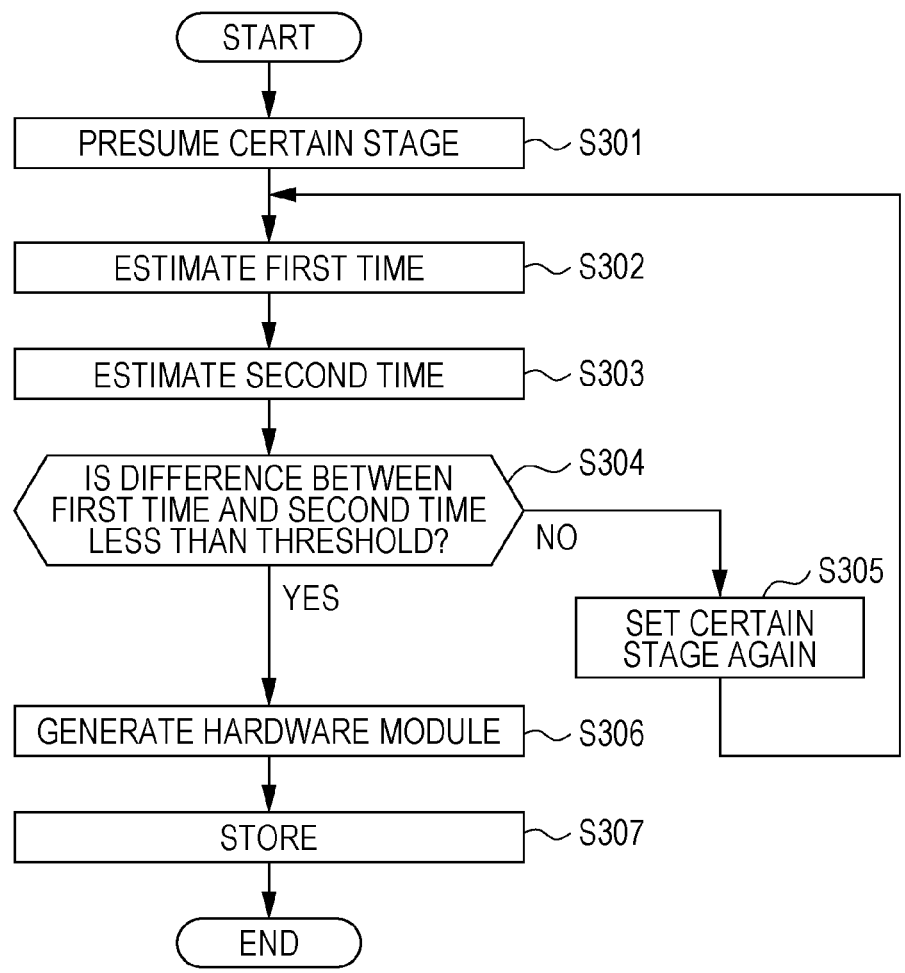
FIG. 14 is a flowchart illustrating an operation flow for generating a hardware module on the basis of results of time estimation.

FIG. 14 is a flowchart illustrating an operation flow for generating a hardware module on the basis of results of time estimation. Upon specifying any one software module that is not associated with a hardware module in the module DB 121, the processor 11 presumes "certain stage" to reach before first processing indicated by the software module is completed (step S301).

Subsequently, the processor 11 estimates a time (referred to as first time) from when the processor 11 starts to execute the first processing until when the first processing reaches the presumed "certain stage" (step S302). For example, this estimation is performed on the basis of a time measured when the processor 11 has executed the first processing indicated by the software module in the past, the number of processing steps, or the like.

In addition, the processor 11 estimates a time (referred to as second time) from the start to the completion of reconfiguration of the hardware module associated with the above-described software module in the programmable logic circuit 16 (step S303). Step S303 may be performed concurrently with step S302 or prior to step S302.

Upon estimation of the first time and the second time being completed, the processor 11 calculates a difference between the first time and the second time and determines whether the difference is less than a threshold (step S304). If it is determined that the difference between the first time and the second time is not less than the threshold (step S304; NO), the processor 11 sets the above-described "certain stage" again such that the first time and the second time become close to each other (step S305), and returns to step S302.

On the other hand, if it is determined that the difference between the first time and the second time is less than the threshold (step S304; YES), the processor 11 specifies, in the first processing, processing to be executed after the "certain stage" that is set at this time as the second processing, generates a hardware module indicating the second processing (step S306), and stores the hardware module in association with the above-described software module (step S307).

In this case, the processor 11 is an example of a processor that determines a certain stage such that a first time and a second time become close to each other, the first time being a time from start until the certain stage of the first processing, the second time being a time until the hardware module is reconfigured in the programmable logic circuit, generates the hardware module indicating the second processing that is processing to be executed after the determined certain stage in the first processing, and reconfigures the generated hardware module in the programmable logic circuit.

Note that a relative size of the second processing to the first processing may be determined on the basis of the position of the above-described certain stage or may be determined on the basis of data to be treated. For example, if the first processing treats image data representing an image, the second processing may be processing that treats part of color components included in the image treated by the first processing. The second processing may alternatively be processing that treats pixels in a partial region included in the image treated by the first processing.

Seventh Modification

In the above-described exemplary embodiment, the program executed by the processor 11 in the information processing apparatus 1 is an example of a program causing a computer including a processor connected to a programmable logic circuit to execute a process including: acquiring a software module indicating first processing and starting the first processing; reconfiguring a hardware module in the programmable logic circuit, the hardware module indicating second processing included in the first processing; and, if reconfiguration of the hardware module is completed before the first processing is completed, supplying intermediate data generated by the first processing to the hardware module and causing the programmable logic circuit to start to execute the second processing.

This program may be provided by being stored in a computer readable storage medium such as a magnetic storage medium, an optical storage medium, a magneto-optical storage medium, or a semiconductor memory. The magnetic storage medium may be a magnetic tape, a magnetic disk, or the like. The optical storage medium may be an optical disk. Alternatively, this program may be downloaded via a communication line such as the Internet.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. An information processing apparatus comprising:
a processor connected to a programmable logic circuit and configured to:
acquire a software module indicating first processing and start the first processing,
reconfigure a hardware module in the programmable logic circuit, the hardware module indicating second processing included in the first processing; and
if reconfiguration of the hardware module is completed before the first processing is completed, supply intermediate data generated by the first processing to the hardware module and cause the programmable logic circuit to start to execute the second processing.

2. The information processing apparatus according to claim 1,
wherein the processor is further configured to:
determine a certain stage such that a first time and a second time become close to each other, the first time being a time from start until the certain stage of the first processing, the second time being a time until the hardware module is reconfigured in the programmable logic circuit;
generate the hardware module indicating the second processing that is processing to be executed after the determined certain stage in the first processing; and
reconfigure the generated hardware module in the programmable logic circuit.

3. The information processing apparatus according to claim 1,
wherein the processor is further configured to:
reconfigure, in the programmable logic circuit, a memory circuit for storing the intermediate data; and
if reconfiguration of the hardware module is completed before the first processing is completed, supply the intermediate data from the memory circuit to the hardware module to cause the programmable logic circuit to start to execute the second processing.

4. The information processing apparatus according to claim 2,
wherein the processor is further configured to:
reconfigure, in the programmable logic circuit, a memory circuit for storing the intermediate data; and
if reconfiguration of the hardware module is completed before the first processing is completed, supply the intermediate data from the memory circuit to the hardware module to cause the programmable logic circuit to start to execute the second processing.

5. The information processing apparatus according to claim 3,
wherein the processor is further configured to:
refrain from storing the intermediate data in the memory circuit if reconfiguration of the hardware module is not completed before the first processing is completed; and
store the intermediate data in the memory circuit if reconfiguration of the hardware module is completed before the first processing is completed.

6. The information processing apparatus according to claim 4,
wherein the processor is further configured to:
refrain from storing the intermediate data in the memory circuit if reconfiguration of the hardware module is not completed before the first processing is completed; and
store the intermediate data in the memory circuit if reconfiguration of the hardware module is completed before the first processing is completed.

7. The information processing apparatus according to claim 3,
wherein the processor is further configured to:
reconfigure, in the programmable logic circuit, a switching circuit that switches a subject that uses the memory circuit from either one of the processor and the hardware module to the other; and
if reconfiguration of the hardware module is completed before the first processing is completed, cause the switching circuit to switch the subject from the processor to the hardware module.

8. The information processing apparatus according to claim 4,
wherein the processor is further configured to:
reconfigure, in the programmable logic circuit, a switching circuit that switches a subject that uses the memory circuit from either one of the processor and the hardware module to the other; and
if reconfiguration of the hardware module is completed before the first processing is completed, cause the switching circuit to switch the subject from the processor to the hardware module.

9. The information processing apparatus according to claim 5,
  wherein the processor is further configured to:
    reconfigure, in the programmable logic circuit, a switching circuit that switches a subject that uses the memory circuit from either one of the processor and the hardware module to the other; and
    if reconfiguration of the hardware module is completed before the first processing is completed, cause the switching circuit to switch the subject from the processor to the hardware module.

10. The information processing apparatus according to claim 6,
  wherein the processor is further configured to:
    reconfigure, in the programmable logic circuit, a switching circuit that switches a subject that uses the memory circuit from either one of the processor and the hardware module to the other; and
    if reconfiguration of the hardware module is completed before the first processing is completed, cause the switching circuit to switch the subject from the processor to the hardware module.

11. The information processing apparatus according to claim 3,
  wherein the processor is further configured to:
    cause, before the first processing is started, the memory circuit to store initial data to be used when the first processing is started; and
    if reconfiguration of the hardware module is completed before the first processing is started, without starting the first processing, supply the initial data from the memory circuit to the hardware module and cause the programmable logic circuit to start to execute the second processing.

12. The information processing apparatus according to claim 4,
  wherein the processor is further configured to:
    cause, before the first processing is started, the memory circuit to store initial data to be used when the first processing is started; and
    if reconfiguration of the hardware module is completed before the first processing is started, without starting the first processing, supply the initial data from the memory circuit to the hardware module and cause the programmable logic circuit to start to execute the second processing.

13. The information processing apparatus according to claim 5,
  wherein the processor is further configured to:
    cause, before the first processing is started, the memory circuit to store initial data to be used when the first processing is started; and
    if reconfiguration of the hardware module is completed before the first processing is started, without starting the first processing, supply the initial data from the memory circuit to the hardware module and cause the programmable logic circuit to start to execute the second processing.

14. The information processing apparatus according to claim 6,
  wherein the processor is further configured to:
    cause, before the first processing is started, the memory circuit to store initial data to be used when the first processing is started; and
    if reconfiguration of the hardware module is completed before the first processing is started, without starting the first processing, supply the initial data from the memory circuit to the hardware module and cause the programmable logic circuit to start to execute the second processing.

15. The information processing apparatus according to claim 7,
  wherein the processor is further configured to:
    cause, before the first processing is started, the memory circuit to store initial data to be used when the first processing is started; and
    if reconfiguration of the hardware module is completed before the first processing is started, without starting the first processing, supply the initial data from the memory circuit to the hardware module and cause the programmable logic circuit to start to execute the second processing.

16. The information processing apparatus according to claim 8,
  wherein the processor is further configured to:
    cause, before the first processing is started, the memory circuit to store initial data to be used when the first processing is started; and
    if reconfiguration of the hardware module is completed before the first processing is started, without starting the first processing, supply the initial data from the memory circuit to the hardware module and cause the programmable logic circuit to start to execute the second processing.

17. The information processing apparatus according to claim 9,
  wherein the processor is further configured to:
    cause, before the first processing is started, the memory circuit to store initial data to be used when the first processing is started; and
    if reconfiguration of the hardware module is completed before the first processing is started, without starting the first processing, supply the initial data from the memory circuit to the hardware module and cause the programmable logic circuit to start to execute the second processing.

18. The information processing apparatus according to claim 10,
  wherein the processor is further configured to:
    cause, before the first processing is started, the memory circuit to store initial data to be used when the first processing is started; and
    if reconfiguration of the hardware module is completed before the first processing is started, without starting the first processing, supply the initial data from the memory circuit to the hardware module and cause the programmable logic circuit to start to execute the second processing.

19. The information processing apparatus according to claim 1,
  wherein the intermediate data includes progress information indicating a progress stage of the first processing when the intermediate data is generated, and
  wherein the processor is further configured to:
    if reconfiguration of the hardware module is completed before the first processing is completed, cause the programmable logic circuit to start to execute the second processing from the progress stage indicated by the progress information included in the intermediate data.

20. A non-transitory computer readable medium storing a program causing a computer including a processor connected to a programmable logic circuit to execute a process for information processing, the process comprising:

acquiring a software module indicating first processing and starting the first processing;

reconfiguring a hardware module in the programmable logic circuit, the hardware module indicating second processing included in the first processing; and if reconfiguration of the hardware module is completed before the first processing is completed, supplying intermediate data generated by the first processing to the hardware module and causing the programmable logic circuit to start to execute the second processing.

* * * * *